United States Patent [19]

Drouot

[11] Patent Number: 5,640,118
[45] Date of Patent: Jun. 17, 1997

[54] VOLTAGE-LIMITING CIRCUIT WITH HYSTERESIS COMPARATOR

[75] Inventor: Sylvie Drouot, Luynes, France

[73] Assignee: SGS-Thomson Microelectronics S.A., Saint Genis, France

[21] Appl. No.: 424,783

[22] Filed: Apr. 19, 1995

[30] Foreign Application Priority Data

Apr. 21, 1994 [FR] France ................................ 94 04984

[51] Int. Cl.$^6$ .................................................. H03K 17/56
[52] U.S. Cl. .......................... 327/306; 327/309; 327/427; 327/535; 327/530; 327/536; 327/205
[58] Field of Search ............................ 327/306, 331, 327/309, 205, 206, 530, 536, 534, 535, 537, 538, 427

[56] References Cited

U.S. PATENT DOCUMENTS

| | | | |
|---|---|---|---|
| 3,962,591 | 6/1976 | Popka | 327/365 |
| 4,471,290 | 9/1984 | Yamaguchi | 327/535 |
| 4,687,954 | 8/1987 | Yasuda et al. | 327/206 |
| 4,980,526 | 12/1990 | Rossi et al. | 327/300 |
| 5,276,646 | 1/1994 | Kim et al. | 365/189 |
| 5,426,334 | 6/1995 | Skovmand | 327/536 |

FOREIGN PATENT DOCUMENTS

| | | | |
|---|---|---|---|
| 0382929 | 8/1990 | European Pat. Off. | G05F 3/20 |
| 2667169 | 3/1992 | France | G05F 1/595 |
| WO-A-9305513 | 3/1993 | WIPO | G11C 16/06 |

Primary Examiner—Timothy P. Callahan
Assistant Examiner—Dinh T. Le
Attorney, Agent, or Firm—Wolf, Greenfield & Sacks, P.C.; James H. Morris; John N. Anastasi

[57] ABSTRACT

In a voltage-limiting circuit, the voltage to be limited is applied to the terminals of a resistive line, and the current flowing in this line is amplified by a current mirror that thus produces a reference current. A current-controlled voltage source receives this reference current and produces a reference voltage. This reference voltage is given to a hysteresis comparator that switches over for two distinct values of the voltage to be regulated. The disclosed device is particularly useful in the field of the load pumps used in electrically programmable memories.

13 Claims, 2 Drawing Sheets

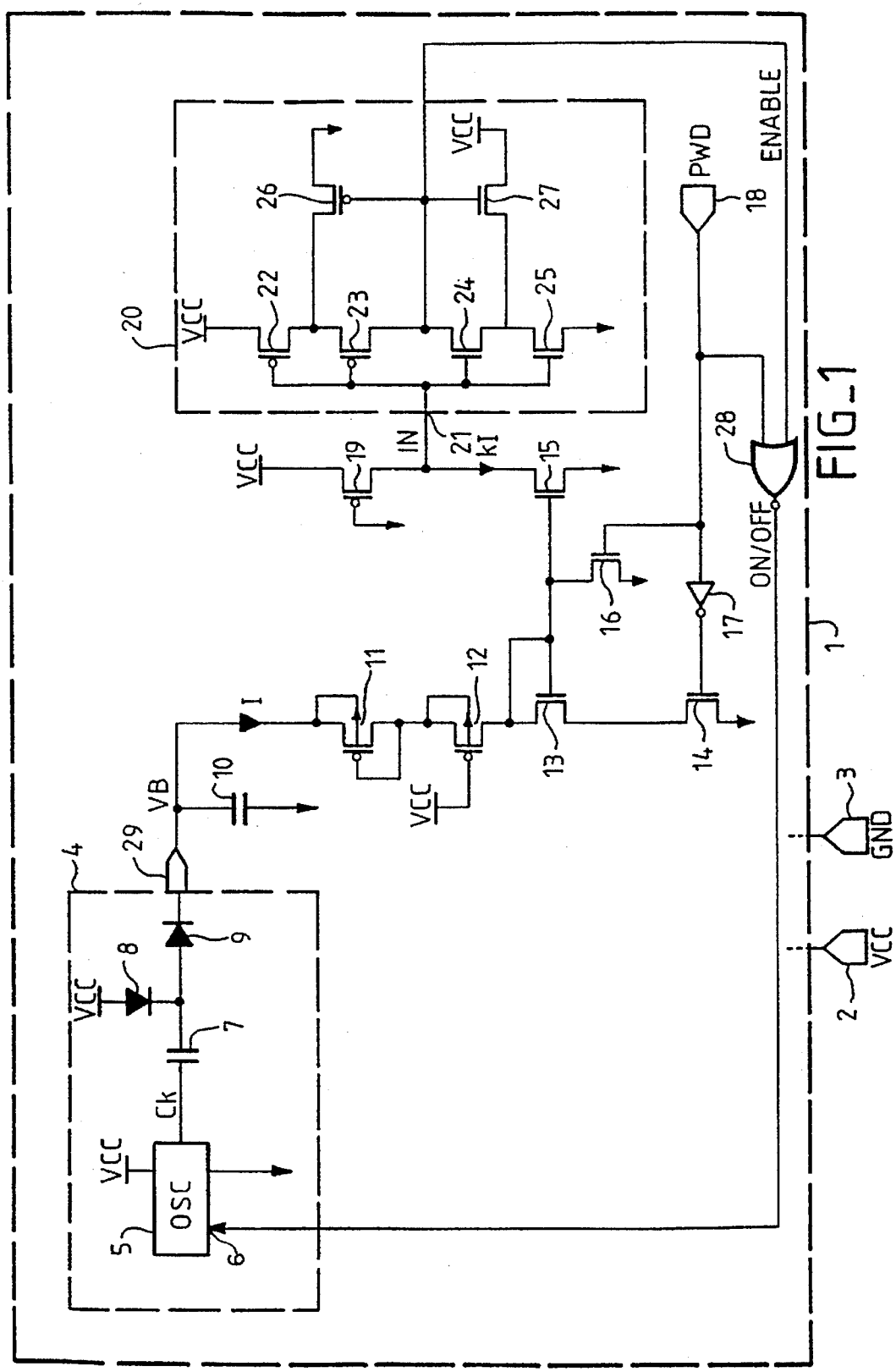
FIG_1

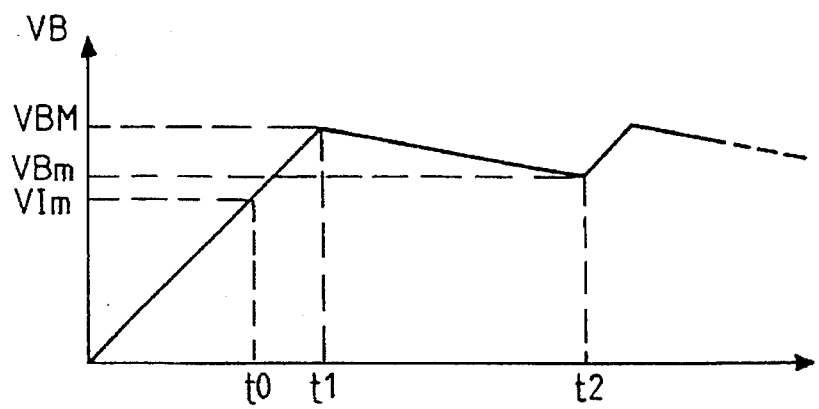
FIG_2a
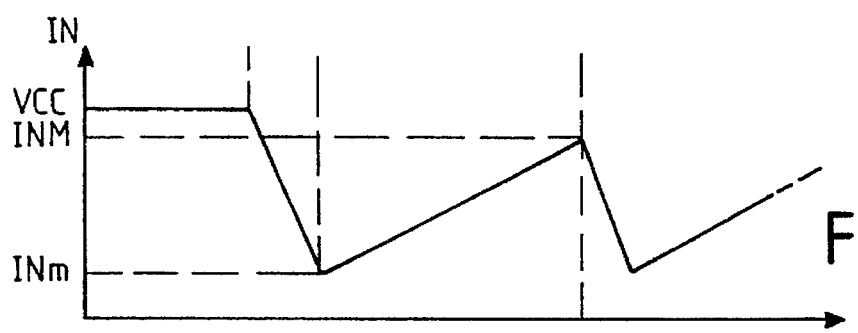
FIG_2b
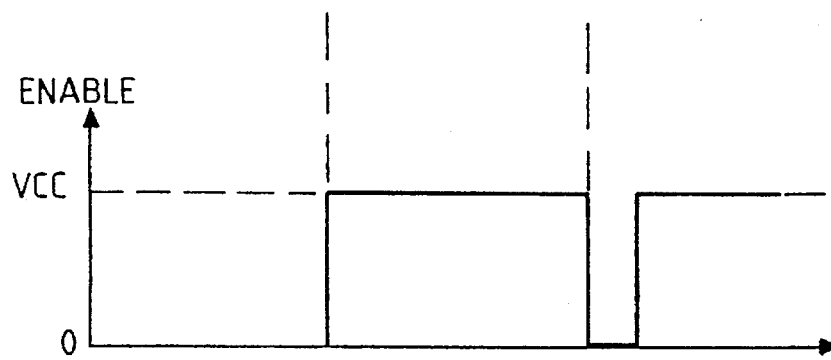
FIG_2c
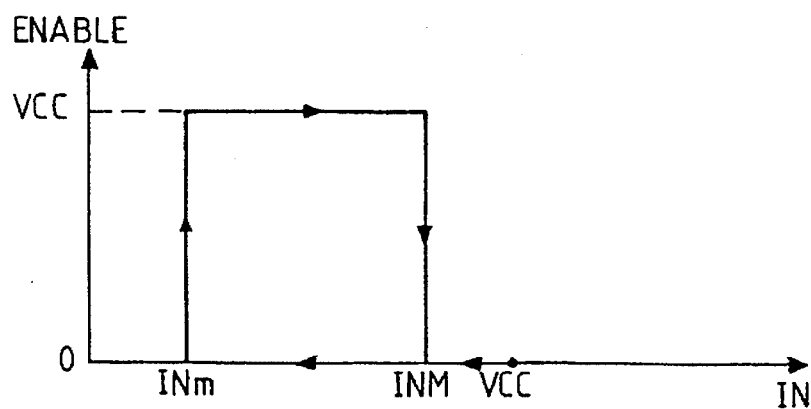
FIG_2d

VOLTAGE-LIMITING CIRCUIT WITH HYSTERESIS COMPARATOR

BACKGROUND OF THE INVENTION

1. Field of the Invention

The invention relates to a voltage-limiting circuit. More particularly, it relates to a voltage-limiting circuit to maintain a voltage produced by a voltage generator.

2. Discussion of the Related Art

In electrically programmable memories, it is generally necessary to have a so-called programming voltage VB available in the integrated circuit, this voltage VB being higher than the normal supply voltage VCC of the circuit. For example, VCC is usually equal to 5 volts and VB to 7 volts at most.

In certain memories, the programming voltage VB is provided inside the integrated circuit, from the normal supply voltage VCC. For this purpose, a voltage multiplier circuit, also called a load pump, is used. This voltage multiplier circuit receives VCC and sets up a voltage VB higher than VCC.

The voltage multiplier circuits basically make use, quite simply, of diodes, two capacitors and a clock signal. In a first stage, the first capacitor is charged up to VCC and then it is discharged into the second capacitor. Then the same operation is started again and the voltage at the terminals of the second capacitor increases gradually.

The programming voltage will thus tend asymptotically towards a borderline or limit value, this limit value being equal to a multiple of the supply voltage VCC (twice VCC in the example described here above).

This type of assembly raises a problem if the nature of the voltage to be reached is the limit value. Indeed, the voltage produced increases ever less rapidly as and when the second capacitor gets charged. To limit the build-up time of the voltage produced to the desired value, it therefore becomes necessary to oversize the load pump. Thus, a limit value greater than the desire value is used. It is then necessary to place a voltage regulator at output of the pump. This regulator limits the voltage produced to the desired value. Furthermore, if the desired value is not a multiple of the value of the supply voltage, the presence of a regulator circuit of this kind becomes logically necessary.

There are two ways of limiting the programming voltage.

A first approach is to reduce without stopping the pump, the excess load given by the pump, once the desired value is reached, by connecting the output of the pump to a ground by means of one or more diodes for example, This approach requires stopping the pump when the desired value is reached and starting it again when the voltage at the terminals of the second capacitor becomes excessively low (this entails the assumption that it is accepted that the voltage produced is within a certain range of values whereas, in the former case, this voltage will be constant).

A second approach has the advantage of consuming less power but makes it necessary, in practice, to produce two reference voltages and to use two comparison circuits to compare these reference voltages with the minimum and maximum voltages acceptable. To produce the reference voltages, Zener diodes are typically used. The second approach therefore entails penalties in terms of the amount of space occupied and in economic terms.

SUMMARY OF THE INVENTION

An object of the invention is to provide a circuit that implements this second approach and is sufficiently compact and inexpensive. Instead of using two circuits to compare the value of the voltage available with two distinct reference values, an embodiment of the invention uses proposes a single regulation circuit that implements a hysteresis voltage comparator.

In this embodiment of the voltage-limiting circuit to limit the value of an internal voltage (VB) given by a supply circuit at an output, the circuit includes a resistive circuit to produce a reference current proportional to the internal voltage, a current-controlled voltage source to produce a reference voltage proportional to the reference current, and a hysteresis comparator receiving the reference voltage at one input and providing a binary signal at one output such that the binary signal goes into a first state when the internal voltage reaches a maximum value and such that the binary signal goes into a second state if the internal voltage subsequently reaches a minimum value.

The resistive circuit preferably has a resistor connected to the output of the supply circuit, a first amplification transistor series-connected between this resistor and a reference terminal, and a second amplification transistor forming a current mirror with the first amplification transistor to produce the reference current in such a way that this current is proportional to the current flowing through the resistor.

Thus, if the supply circuit is a load pump, a resistive line is connected to the output of this load pump. A current is therefore tapped at the output of the pump and copied by a current mirror. This enables the tapping of a low current, thus limiting the total consumption of the circuit and preventing an excessive increase in the build-up time of the voltage produced by the pump. Indeed, the more capacitive is the load at output, the shorter is the build-up time of the load pumps.

In order to limit the consumption, the resistive line will be preferably made in such a way that the current tapped will be zero when the voltage produced by the load pump is lower than a certain threshold. The reference voltage source will preferably have at least one reference resistor series-connected between a supply terminal and the second transistor of the current mirror. There will thus be produced a reference voltage accessible at the midpoint of this resistor and this transistor.

BRIEF DESCRIPTION OF THE DRAWINGS

Other characteristics and advantages of the invention shall appear from the following detailed description made with reference to the appended figures, of which:

FIG. 1 shows an embodiment of the invention,

FIGS. 2a to 2d show timing diagrams of electrical signals corresponding to the circuit of FIG. 1.

DETAILED DESCRIPTION

FIG. 1 shows an integrated circuit 1, according to the present invention, including a supply terminal 2 coupled to a supply voltage VCC, and a reference terminal 3 coupled to a base voltage GND. A load pump circuit 4 is provided to produce an internal voltage VB from the supply voltage VCC, this internal voltage VB being higher than this supply voltage VCC. In one example, VCC is equal to 3 volts, the reference terminal 3 is a ground and the desired voltage VB ranges from 4.9 to 5.4 volts.

It will be noted that the detailed description is made with reference to an advantageous application in an integrated circuit of an electrically programmable memory type. It is to be appreciated that this is only a particular example, a limiting circuit defined according to the invention could very well be used to limit a voltage produced by a supply circuit that is not implanted in a same integrated circuit. Similarly, the limiting circuit as described could very well be made with discrete components without departing from the scope of the invention.

According to one embodiment of the invention, a load pump 4 that doubles the supply voltage VCC is included in the voltage-limiting circuit. This pump 4 has an oscillator 5 to give a clock signal Ck. This signal is applied to a terminal of a capacitor 7. The other terminal of this capacitor 7 is connected, firstly, to the supply terminal 2 by means of a diode 8 and, secondly, to an output 29 by means of a diode 9. This output terminal 29 is connected to the first terminal of an output capacitor 10. The output capacitor 10 has its other terminal connected to the reference terminal 3.

The output capacitor 10 is considered here to be the equivalent of a capacitive circuit supplied by the load pump 4. This explains the fact that this pump has only one capacitor 7. The internal voltage VB is the voltage present at the output 29 of the load pump 4.

To stop the load pump 4, it is assumed that the oscillator 5 has an input 6 to receive a logic ON/OFF signal in such a way that the oscillator 7 works if ON/OFF is in the logic state 1 and stops if it is in the logic state 0. If ON/OFF=1, the clock signal CK will be constant and at the ground potential and therefore will not be able to charge the capacitor 7.

The output 29 is connected to the source of a first PMOS type transistor 11. This transistor 11 has its control gate connected to its drain. It is therefore mounted as a diode. Furthermore, assuming that the integrated circuit 1 is made on a P type substrate, the well of the transistor 11 will be connected to its source. This makes it possible to have a more stable and relatively low threshold voltage (with the elimination of the so-called substrate effect on the threshold voltage).

The drain of the first PMOS type transistor 11 is connected to the source of a second PMOS type transistor 12. Similarly, for this first PMOS type transistor 11, the second PMOS type transistor 12 has its well connected to its source. The control gate of this second transistor 12 is connected to the supply terminal 2 and therefore receives VCC.

The drain of the second PMOS type transistor 12 is connected to the drain and to the control gate of a first NMOS type amplification transistor 13. The gate of this first amplification transistor 13 is connected to the control gate of a second NMOS type amplification transistor 15, and the set of these amplification transistors forms a current mirror.

The source of the first amplification transistor 13 is connected to the ground by means of a first NMOS type insulation transistor 14. Furthermore, the control gates of the amplification transistors 13 and 15 are connected to the ground by means of a second insulation transistor 16. The control gate of this second insulation transistor 16 is connected to a control terminal 18 and receives a limitation control binary signal PWD. The control terminal 18 is connected to the input of an inverter 17 whose output is connected to the control gate of the first insulation transistor 14.

The source of the second amplification transistor 15 is connected to the ground 3. Its drain is connected to the drain of a PMOS type reference transistor 19 whose source is connected to the supply terminal 2.

The control gate of this reference transistor 19 is connected to the ground 3.

In a first state, it shall be assumed that PWD=0. The first insulation transistor 14 is therefore on and the second insulation transistor 16 is off.

If the ON/OFF logic signal goes from 0 to 1, then the oscillator will work and the internal voltage VB will gradually increase. Assuming that the first and second PMOS type transistors 11 and 12 have an identical threshold voltage Vtp, a current I will flow in these transistors as soon as VB is higher than VCC+2*Vtp. Assuming Vtp to be equal to 1 volt, the current I will flow in the transistors 11 and 12 as soon as VB is equal to 4 volts (with VCC equal to 3 volts).

This current I will be copied by the current mirror and the current kI (k referring to the gain of the current mirror) called a reference current will flow in the reference transistor 19 which behaves like a reference resistor with a value R. The assembly formed by the current mirror, the reference transistor 19 and the supply terminal 2 behaves like a current-controlled voltage source that gives a reference voltage IN=VCC−R*kI that is accessible at the drain of the reference transistor 19.

Preferably, the second PMOS type transistor 12 and the reference transistor 19 will be resistive.

In one embodiment, the value chosen for the ratio W/L (gate width expressed in micrometers to gate length expressed in micrometers) will be, for example, 3/30 for the second PMOS type transistor 12 and 3/80 for the reference transistor 19.

Thus, the current I going through the second PMOS type transistor 12 could be equal to 0.5 to 1 microampere. No major current will be tapped at the output capacitor 10 and the build-up time of the internal voltage VB will not increase significantly (with respect to the build-up time if only the output capacitor 10 is connected to the output 19 of the load pump 4).

Furthermore, in another embodiment, by fixing a value of W/L=3/10 for the first amplification transistor 13 and W/L= 3/1 for the second amplification transistor 15, a gain k=10 will be obtained for the current mirror. This substantial gain makes it possible to produce a reference voltage IN that varies greatly as a function of the tapped current I, the reference transistor 19 being furthermore resistive.

The reference voltage IN is given to an input 21 of a hysteresis comparator 20. Though, the hysteresis comparator has its input connected to the midpoint of the second amplification transistor and the reference resistor.

In one embodiment, the hysteresis comparator 20 has a first PMOS type transistor 22 whose source is connected to the supply terminal 2 and whose control gate is connected to the input 21, a second PMOS type transistor 23 having its source connected to the drain of the first PMOS type transistor 22 and its control gate connected to the input 21, a first NMOS type transistor 24 having its drain connected to the drain of the second PMOS type transistor 23 and its control gate connected to the input 21, and a second NMOS type transistor 25 having its drain connected to the source of the first NMOS type transistor 24, its control gate connected to the input 21 and its source connected to the ground.

The embodiment of the hysteresis comparator 20 further includes a third PMOS type transistor 26 having its source connected to the ground, its drain connected to the source of the second PMOS type transistor 23 and its control gate connected to the drain of this second transistor 23, and a third NMOS type transistor 27 having its source connected to the supply terminal 2, its drain connected to the source of the first NMOS type transistor 24, and its control gate connected to the drain of this first transistor 24.

Further, the midpoint of the second PMOS type transistor 23 and of the first NMOS type transistor 24 corresponds to the output of the hysteresis comparator and provides a binary signal ENABLE.

When no current I flows in the resistive arm connected to the output 29, the first and second NMOS type transistors 24 and 25 are on and the third NMOS type transistor 27 is off. The signal ENABLE is then at 0. Besides, the third PMOS type transistor 26 is on and the second PMOS type transistor 23, which is off, has its source at the ground and its control gate at VCC.

When the current I starts flowing in the resistive arm, the reference voltage IN starts dropping. The first and second PMOS type transistors 22 and 23 therefore tend to come on. Nevertheless, the presence of the third PMOS type transistor 26 tends to increase their threshold voltage and the switchover voltage therefore shifts downwards.

Similarly, the third NMOS type transistor 27 tends to increase the threshold voltage of the first and second NMOS type transistors 24 and 25 when the reference voltage increases.

There will therefore be two different values of reference voltage to turn the PMOS type transistors and the NMOS type transistors on.

The lower is the resistivity of the third NMOS type transistor 27 and PMOS type transistor 26, the greater is the shift in the reference values prompting an upward or downward switch-over.

It is possible for example to fix a reference voltage value INM of 2.3 volts to turn the NMOS type transistors 24 and 25 on and a reference voltage value INm of 0.7 volts to turn the PMOS type transistors 22 and 23 on.

Since the value of the reference voltage IN is a function of the internal voltage VB, there will therefore be produced a binary signal ENABLE going from 0 to 1 for a maximum value VBM of VB and going from 1 to 0 for a minimum value VBm of VB (for example VBM=5.4 volts and VBm=4.9 volts).

The output of the hysteresis comparator is connected to an input of a two-input NOR gate 28. The other input of this NOR gate 28 receives the limitation control signal PWD. The output of the NOR gate 28 is connected to the input 6 of the oscillator 5 and therefore gives it the logic signal ON/OFF.

So long as PWD=0, the signal ON/OFF follows the variations of the binary signal ENABLE, its state being reversed with respect to that of the signal ENABLE.

If it is desired to stop the assembly formed by the load pump 4 and the current-limiting circuit, it is enough to place PWD at 1. Thus the signal ON/OFF goes to 0 and the oscillator is stopped. Furthermore, the first insulation transistor 14 will be off while the second insulation transistor 16 will come on. Hence there will no longer be any current flowing in the resistive arm and in the reference transistor 19.

The output capacitor 10 will thus remain charged. This possibility of reducing consumption is particularly valuable if it is desired to use a low consumption mode while at the same time making arrangements for the possibility of returning rapidly to an operational state.

FIG. 2a illustrates the changes undergone by the internal voltage as a function of VB. When VB rises and reaches a threshold VIm at an instant t0, a current starts flowing in the resistive arm. The reference voltage IN (illustrated in FIG. 2b) initially at VCC starts falling.

At a subsequent instant t1, IN reaches the value INm. The PMOS type transistors 22 and 23 of the comparator come on and the signal ENABLE (shown in FIG. 2c), initially at 0, will go to 1. The load pump will therefore be stopped. The voltage therefore cannot go beyond the value VBM corresponding to this instant t1.

If the value of VB drops, the reference voltage IN will rise. Assuming that it reaches the value INM at an instant t2, the NMOS type transistors 24 and 25 of the comparator will come on and the signal ENABLE will go to 0, prompting the starting of the load pump and the rise of VB.

The voltage hysteresis produced is illustrated in FIG. 2d, this figure showing the changes undergone by the signal ENABLE as a function of the reference voltage IN.

The above description is given by way of an indication that is no way restrictive. Thus, the PMOS type transistors 11 and 12 of the resistive arm could have been replaced by a PMOS type transistor acting as a resistor, similarly to the reference transistor 19. Nevertheless, this would have had the drawback of increasing the consumption of this arm and of thus reducing the effectiveness of the load pump. Similarly, it would be possible to do without the insulation transistors and to replace the NOR gate 28 by an inverter if it is not desired to propose a low consumption mode.

Having thus described several particular embodiments of the invention, various alterations, modifications, and improvements will readily occur to those skilled in the art. Such alterations, modifications, and improvements are intended to be within the spirit and scope of the invention. Accordingly, the foregoing description is by way of example only and is limited only as defined in the following claims and the equivalents thereto.

What is claimed is:

1. A voltage-limiting circuit which limits a value of a supply voltage provided by a supply circuit, at an output of the voltage-limiting circuit, the voltage-limiting circuit comprising:

resistive means, having an input coupled to the supply voltage and an output, for providing a reference current proportional to the supply voltage;

a current-controlled voltage source having an input coupled to the output of the resistive means, which provides a reference voltage proportional to the reference current;

a hysteresis comparator including at least one P-channel transistor and at least one N-channel transistor which receives the reference voltage at a first input and provides a binary signal at an output, such that the binary signal goes to a first state when the reference voltage reaches a maximum value and goes to a second state if the supply voltage reaches a minimum value; and a control means, having an input coupled to the output of the hysteresis comparator, for keeping the binary signal in its second state irrespective of the value of supply voltage, in response to a limitation control signal in a first state.

2. The circuit according to claim 1, wherein the supply circuit includes a voltage multiplier having an input coupled to a control signal provided by the control means, such that the supply voltage is kept between its maximum value and its minimum value when the limitation control signal is in its second state.

3. A voltage-limiting circuit which limits a value of a supply voltage provided by a supply circuit, at an output of the voltage-limiting circuit, the voltage-limiting circuit comprising:

resistive means, having an input coupled to the supply voltage and an output, for providing a reference current proportional to the supply voltage;

a current-controlled voltage source having an input coupled to the output of the resistive means, which provides a reference voltage proportional to the reference current;

a hysteresis comparator including at least one P-channel transistor and at least one N-channel transistor which receives the reference voltage at a first input and provides a binary signal at an output, such that the binary signal goes to a first state when the reference voltage reaches a maximum value and goes to a second state if the supply voltage reaches a minimum value;

wherein the resistive means and the current controlled voltage source include a resistive circuit connected to the output of the supply circuit, a first amplification transistor having its drain and source series-connected between the resistive circuit and a reference terminal, and a second amplification transistor having its base coupled to a base of the first amplification transistor, a drain, and a source coupled to the reference terminal, the second amplification transistor forming a current mirror with the first amplification transistor to produce the reference current at the drain of the second amplification transistor, such that the reference current is proportional to the current flowing through the resistive circuit; and a means, coupled to the current mirror and responsive to a limitation control signal, for canceling the reference current flowing through the amplification transistors of the current mirror when the limitation control signal is in a first state.

4. A voltage-limiting circuit which limits a value of a supply voltage provided by a supply circuit, at an output of the voltage-limiting circuit, the voltage-limiting circuit comprising:

a resistive circuit, having an input coupled to the supply voltage and an output, which provides a reference current proportional to the supply voltage;

a current-controlled voltage source, having an input coupled to the output of the resistive circuit, which provides at an output a reference voltage proportional to the reference current;

a comparator circuit, including at least one P-channel transistor and at least one N-channel transistor, having a first input coupled to the output of the current-controlled voltage source, which provides at an output an enable signal which goes to a first state when the supply voltage reaches a maximum value and which goes to a second state when the supply voltage reaches a minimum value; and a logic circuit having first input coupled to the output of the comparator circuit, an output providing a control signal, and a second input coupled to a limitation control signal, wherein the control signal is in a second state irrespective of the value of the supply voltage, in response to the limitation control signal in a first state, and wherein the control signal is in a first state which follows the enable signal provided at the output of the comparator circuit in response to the limitation control signal in a second state.

5. The voltage-limiting circuit as claimed in claim 4, further comprising a shorting circuit, coupled to the resistive circuit, which shorts the reference current to ground in response to the limitation control signal being in a first state.

6. The voltage-limiting circuit as claimed in claim 4, further comprising a supply circuit which provides the supply voltage, in a response to the control signal in the first state and which does not provide a supply voltage in response to the control signal in the second state.

7. A method for limiting a supply voltage to a voltage potential greater than a voltage of an internal voltage, the method comprising steps of:

multiplying the internal voltage to the greater potential supply voltage;

providing a reference current proportional to the greater potential supply voltage;

providing a reference voltage proportional to the reference current;

comparing the reference voltage to a maximum value, comparing the reference voltage to a minimum value, and outputting a logic signal in a first state when the reference voltage reaches the maximum value and outputting the logic signal in a second state when the reference voltage reaches the minimum value;

providing the supply voltage a logic signal is in the first state; and clamping the logic signal in the second state irrespective of the value of the supply voltage in response to a limitation control signal in a first state.

8. A method for limiting a supply voltage to a voltage potential greater than a voltage of an internal voltage, the method comprising steps of:

multiplying the internal voltage to the greater potential supply voltage;

providing a reference current proportional to the greater potential supply voltage;

providing a reference voltage proportional to the reference current;

comparing the reference voltage to a maximum value, comparing the reference voltage to a minimum value, and outputting a logic signal in a first state when the reference voltage reaches the maximum value and outputting the logic signal in a second state when the reference voltage reaches the minimum value;

providing the supply voltage a logic signal is in the first state; and substantially zeroing out the reference current in response to a limitation control signal in a first state.

9. The method as claimed in claims 7 or 8, further comprising the step of maintaining the supply voltage between the maximum value and the minimum value in response to the limitation control signal in the first state.

10. A voltage-limiting circuit which limits a value of a supply voltage provided by a supply circuit, at an output of the voltage-limiting circuit, the voltage-limiting circuit comprising:

a resistive circuit, having an input coupled to the supply voltage and an output, which provides a reference current proportional to the supply voltage;

a current-controlled voltage source, having an input coupled to the output of the resistive circuit, which provides at an output a reference voltage proportional to the reference current;

a comparator circuit, having a first input coupled to the output of the current-controlled voltage source, which provides at an output an enable signal which goes to a first state when the supply voltage reaches a maximum value and which goes to a second state when the supply voltage reaches a minimum value;

a logic circuit having first input coupled to the output of the comparator circuit, an output providing a control signal, and a second input coupled to a limitation control signal, wherein the control signal is in a second state irrespective of the value of the supply voltage, in response to the limitation control signal in a first state, and wherein the control signal is in a first state which follows the enable signal provided at the output of the comparator circuit in response to the limitation control signal in a second state.

11. The voltage-limiting circuit as claimed in claim 10, further comprising a shorting circuit, coupled to the resistive circuit, which shorts the reference current to ground in response to the limitation control signal being in a first state.

12. The voltage-limiting circuit as claimed in claim 10, further comprising a supply circuit which provides the supply voltage, in a response to the control signal in the first state and which does not provide a supply voltage in response to the control signal in the second state.

13. The voltage-limiting circuit as claimed in claim 12, wherein the supply circuit in response to the control signal in the first state limits the supply voltage between a maximum value and a minimum value when the limitation control signal is in the second state.

* * * * *